United States Patent [19]

Blouke et al.

[11] Patent Number: 4,739,382

[45] Date of Patent: Apr. 19, 1988

[54] PACKAGE FOR A CHARGE-COUPLED DEVICE WITH TEMPERATURE DEPENDENT COOLING

[75] Inventors: Morley M. Blouke, Beaverton; Raymond S. Enochs, Hillsboro, both of Oreg.

[73] Assignee: Tektronix, Inc., Beaverton, Oreg.

[21] Appl. No.: 740,095

[22] Filed: May 31, 1985

[51] Int. Cl.⁴ .................. H01L 23/56; H01L 23/34; H01L 27/02; H01L 29/78

[52] U.S. Cl. ............................ 357/28; 357/24; 357/51; 357/80; 357/83; 219/209

[58] Field of Search ............... 357/24, 28, 51, 80, 357/81, 82, 83; 219/209

[56] References Cited

U.S. PATENT DOCUMENTS

| | | | |
|---|---|---|---|
| 3,431,392 | 3/1969 | Garland et al. | 357/28 |
| 3,440,407 | 4/1969 | Goltsos et al. | 219/209 |
| 3,714,527 | 1/1973 | Schmidt | 357/28 |
| 3,872,418 | 3/1975 | Plough et al. | 357/28 |
| 3,887,785 | 6/1975 | Ahlport | 219/209 |
| 4,009,482 | 2/1977 | Nakata | 357/28 |
| 4,329,701 | 5/1982 | Brenneman | 357/28 |
| 4,374,316 | 2/1983 | Inamori et al. | 219/209 |
| 4,422,091 | 12/1983 | Liu | 357/24 LR |

FOREIGN PATENT DOCUMENTS

| | | | |
|---|---|---|---|
| 59-104187 | 6/1984 | Japan | 357/83 |
| 59-136968 | 8/1984 | Japan | 357/28 |

*Primary Examiner*—Gene M. Munson
*Attorney, Agent, or Firm*—John Smith-Hill; John D. Winkelman; William S. Lovell

[57] ABSTRACT

A charge-coupled device package comprises a substrate of dielectric material and a charge-coupled device die mounted on one main face of the substrate. The substrate is placed in heat exchange relationship with a cold sink, such as a bath of LN₂. A temperature sensor senses the temperature at a location on the main face that is in close proximity ot the die. A film resistor is adhered to the opposite main face of the substrate and receives a current that depends upon the temperature sensed by the sensor.

7 Claims, 1 Drawing Sheet

PACKAGE FOR A CHARGE-COUPLED DEVICE WITH TEMPERATURE DEPENDENT COOLING

This invention relates to a package for a charge-coupled device.

BACKGROUND OF THE INVENTION

A silicon charge-coupled device (CCD) imager is preferably used at a temperature in the range from about −100 degrees C. to −150 degrees C. in order to reduce the dark current to an acceptable level. It is conventional to achieve this low temperature by mounting the imager on a copper block that is in heat exchange relationship with a vessel that contains a liquid cryogen, for example liquid nitrogen ($LN_2$). At standard pressure, liquid nitrogen evaporates at approximately −196 degrees C. It is not desirable to operate the imager at a temperature as low as −196 degrees C. because carrier freeze-out typically occurs, rendering the device inoperative. In order to elevate the temperature of the imager to the desired operating range, the thermally-conductive coupling between the imager and the liquid cryogen vessel is kept quite loose, e.g. by keeping the copper block physically spaced from the liquid cryogen vessel and connecting the copper block to the vessel using copper braids. Moreover, a temperature sensor is mounted on the copper block and a heat source, such as a resistive heater, is coupled to the thermal path between the copper block and the liquid cryogen vessel. A control circuit controls the supply of current to the resistive heater, in dependence upon the temperature sensed by the sensor, and therefore the temperature of the copper block and of the imager carried thereby is controlled with a degree of accuracy that is generally satisfactory.

However, the conventional technique is far from ideal, and in particular is subject to the disadvantages that the heat sensor is spaced from the imager and therefore does not sense the temperature of the imager, and the spacing of the heater from the sensor implies that there is a considerable time delay between a change in the temperature sensed by the sensor and the corresponding countervailing change in temperature caused by corrective action of the control circuit.

SUMMARY OF THE INVENTION

In a preferred embodiment of the invention a charge-coupled device package comprises a substrate of dielectric material and a charge-coupled device die mounted on one main face of the substrate. In use, the substrate is placed in heat exchange relationship with a cold sink, such as a bath of $LN_2$. A temperature sensor senses the temperature at a location on the substrate's main face that is in close proximity to the die. A film resistor is adhered to the opposite main face of the substrate, and in use the film resistor receives a current that depends upon the temperature sensed by the sensor.

By integrating the heating resistor with the substrate, a more convenient and compact package is provided than can be obtained using conventional techniques. Moreover, the proximity of the resistor to the die and to the temperature sensor reduces the response time between a change in temperature observed by the sensor and the corrective change in current delivered to the film resistor.

BRIEF DESCRIPTION OF THE DRAWINGS

For a better understanding of the invention, and to show how the same may be carried into effect, reference will now be made, by way of example, to the accompanying drawing in which.

DETAILED DESCRIPTION

Figure 1:
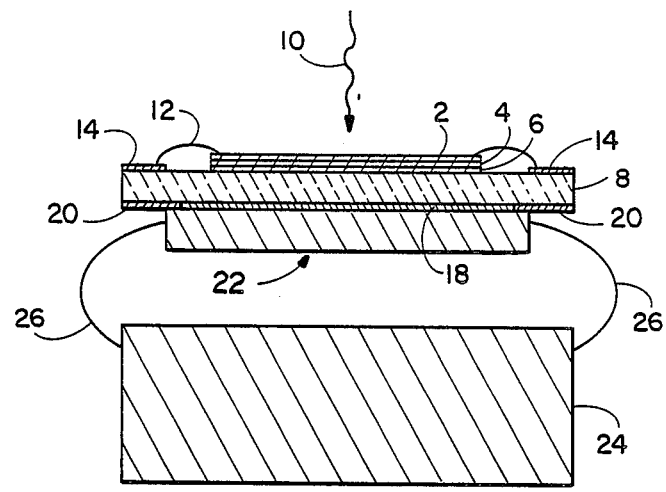
FIG. 1 is a sectional view of a ceramic substrate having a CCD imager mounted on its upper surface.

FIG. 1 illustrates a CCD imager package comprising a CCD die 2 mounted on an expansion-matching support 4 that is secured by means of solder 6 to a ceramic substrate 8. The support 4 is used to provide mechanical support for the die during thinning, as discussed in U.S. Pat. No. 4,422,091. It will therefore be understood that the back surface of the die, i.e. the surface opposite that through which the die is processed and at which the die is metallized to provide electrodes, is the surface that is uppermost in FIG. 1 and receives incident optical radiation 10.

The die is square or rectangular, and has bonding pads (not shown) distributed about its periphery. The bonding pads are connected by bond wires 12 to contact pads 14 that are distributed about the perimeter of the upper surface of the substrate 8. Leads (not shown), which may be of conventional form, are used to connect the contact pads to external circuitry.

Figure 2:
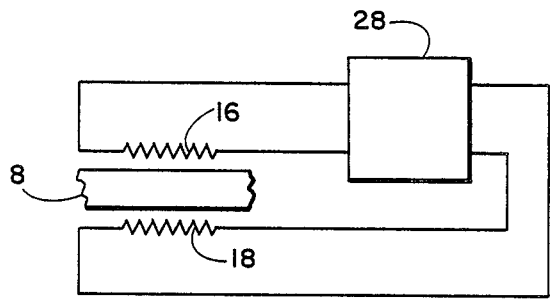
FIG. 2 is a schematic diagram, partly in block form, of an electrical circuit.

The CCD die incorporates a resistor 16 (not shown in FIG. 1; shown only schematically in FIG. 2) that is used for sensing the temperature of the die. The terminals of the resistor 16 are connected to two of the pads 14. The resistance value of the resistor 16 depends quite strongly on temperature. The resistor may be made of polysilicon or nichrome, for example.

The ceramic substrate 8 has on its lower face a thick-film ruthenium oxide resistor 18 that is connected at its terminals to contact pads 20 at the perimeter of the lower surface of the substrate. Additional leads (not shown) are used to connect the pads 20 to external circuitry. The resistor 18 is configured to provide a uniform distribution of heat over the back face of the substrate. Preferably, the resistor is broken down into a square, 10×10 array of 100 small resistors, the ten resistors in each column of resistors being connected in parallel and the ten columns being connected in series.

In use, the package comprising the substrate 8, the die 2 and the resistor 18 is mounted to a block 22 of copper using a dielectric adhesive, and the block 22 is connected to a cold sink 24, such as a bath of $LN_2$, in thermally conductive manner, e.g. by means of copper braids 26. The die 2 is thus placed in heat exchange relationship with the $LN_2$, and this depressed the temperature of the die 2. The resistor 18 is used to heat the substrate and thus prevent the die from being cooled to too low a temperature.

The external circuitry to which the leads are connected includes not only circuits for applying clock pulses to the CCD gates and extracting charge from the CCD channels by way of the CCD's output electrodes, but also a control circuit 28 for measuring the resistance of the resistor 16 and controlling the current supplied to the resistor 18 in dependence on the measured resistance value. For example, the resistance measuring circuit may be a Wheatstone bridge with its reference resistor having a resistance value equal to the resistance of the resistor 16 at the desired temperature of the CCD die, in which case the current control circuit would control the current supplied to the resistor 18 in such a manner as to bring the resistance of the resistor 16 to the same value as that of the reference resistor.

It will be appreciated that the present invention is not restricted to the particular package that has been shown and described, and that variations may be made therein without departing from the scope of the invention as defined in the appended claims, and equivalents thereof. For example, the resistor 16 need not be incorporated in the CCD die 2, and may be mounted on the substrate separately from the die. The temperature sensor need not even be a resistor, since other components exhibit behavior that is sufficiently temperature-dependent to enable those components to be used as temperature sensors. The invention is not restricted to use with CCD imagers, since CCD dice used in other applications may suffer from problems due to dark current, nor is the invention restricted to use with CCD dice, but may be used with other hybrid integrated circuits where it is desired that the circuit dice be maintained at a temperature that is below ambient but is not as low as that of a convenient cold sink. Even in the case where the invention is used with a CCD imager, it is not necessary that the die be thinned because an imager having sufficient sensitivity for some purposes may be made without thinning the die.

We claim:

1. A hybrid integrated circuit package comprising a substrate of dielectric material having two main faces, at least one integrated circuit die mounted on one main face of the substrate, a temperature sensing resistor incorporated within said at least one integrated circuit die, and a film resistor adhered to the opposite main face of the substrate.

2. A package according to claim 1, wherein the integrated circuit die is a charge-coupled device die.

3. A hybrid integrated circuit package comprising a substrate of dielectric material having two main faces, at least one integrated circuit die mounted on one main face of the substrate, means for sensing the temperature at a location on said one main face that is in close proximity to the die, and a thick film resistor adhered to the opposite main face of the substrate.

4. A package according to claim 3, wherein the integrated circuit die is a charge-coupled device die.

5. A device for controlling the temperature of an integrated circuit comprising:
    a substrate of dielectric material having two main faces,
    at least one integrated circuit die mounted on one main face of the substrate;
    means for sensing the temperature at a location on said one main face that is in close proximity to the die
    a film resistor adhered to the opposite main face of the substrate, and
    a heat absorbing means that is loosely thermally coupled to said substrate.

6. The device of claim 5 wherein said heat absorbing means comprises a cryogenically cooled vessel, a block of thermally conductive metal attached to said substrate, and connective means for interconnecting said vessel and said metal.

7. The device of claim 6 wherein said thermally conductive metal is copper and said connective means comprises copper braid.

* * * * *